United States Patent [19]

van der Mast et al.

[11] Patent Number: 4,618,766

[45] Date of Patent: Oct. 21, 1986

[54] AUTOMATICALLY ADJUSTABLE ELECTRON MICROSCOPE

[75] Inventors: Karel D. van der Mast, Pynacker; Ulrich Gross, Eindhoven, both of Netherlands

[73] Assignee: U.S. Philips Corporation, New York, N.Y.

[21] Appl. No.: 773,721

[22] Filed: Sep. 9, 1985

Related U.S. Application Data

[63] Continuation-in-part of Ser. No. 608,599, May 9, 1984, abandoned.

[30] Foreign Application Priority Data

Dec. 7, 1983 [NL] Netherlands .......................... 8304217

[51] Int. Cl.$^4$ ..................... G01N 23/04; G01N 23/225
[52] U.S. Cl. ..................................... 250/311; 250/310; 250/307; 250/396 R; 250/397

[58] Field of Search ................... 250/310, 311, 396 R, 250/397, 307

[56] References Cited

U.S. PATENT DOCUMENTS

| 4,097,740 | 6/1978 | Muller et al. | 250/311 |
| 4,379,230 | 4/1983 | Bouwhuis et al. | 250/311 |
| 4,379,231 | 4/1983 | Shii et al. | 250/311 |

Primary Examiner—Bruce C. Anderson
Assistant Examiner—Jack I. Berman
Attorney, Agent, or Firm—Paul R. Miller

[57] ABSTRACT

In order to find criteria for the adjustment of an optimum focus, lens correction, specimen shift and the like, measurements are performed by means of a beam wobbler and the corresponding generation of a variable $F(s) = \Theta |(X_i - Y_i + s)|^*$ in order to determine that s-value for which F(s) is a minimum. Using this image shift value is then used to make a correction preferably automatically.

13 Claims, 1 Drawing Figure

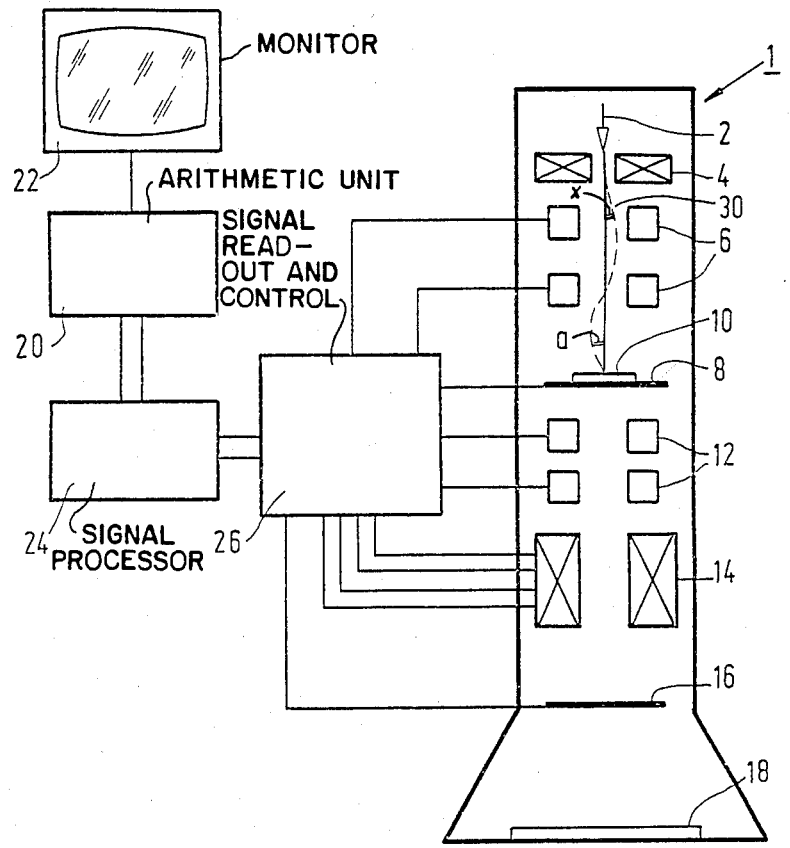

AUTOMATICALLY ADJUSTABLE ELECTRON MICROSCOPE

This application is a continuation-in-part of U.S. application Ser. No. 608,599, filed May 9, 1984, abandoned.

The invention relates to a method of adjusting an image correcting control in an electron microscope including an electron source, an illumination beam tilting device, an electron-optical lens system, and an electron detection device, and also relates to an electron microscope which is arranged to perform this method.

A method and an electron microscope of such a kind are known from an article by H. Koops and G. Walter in "Proceedings Europ. Congr. on EM", The Hague, 1980, Vol. I, pp. 40–41. The method described therein utilizes a specimen in the form of a diaphragm with a small central hole which is to be irradiated by the electron beam from different directions, and a detector which is also provided with an input diaphragm barrier having a small central hole through which the undeflected electron beam passes. In this arrangement the image shift with a change in the irradiation direction is measured by determining the current intensity which has to be applied to a second beam deflection device arranged beyond the specimen in order to make the electron beam pass through the central hole in the detector again. The defocusing effect can thus be measured by performing the measurement with different values of the beam angle. Astigmatism can be measured by performing the measurement for different azimuthal values of the beam angle. Using the values thus measured, the focus can be readjusted and, for example a stigmator can be energized in order to minimize the astigmatism.

The use of a specific specimen in the form of a central aperture in a diaphragm and an adapted detector provided with a diaphragm having a small central hole renders this method unsuitable for focus adjustment in practical cases. This is because, after adjusting the focus or compensating for the astigmatism, the aperture would have to be replaced by a specimen to be examined and, moreover, it might also be necessary to adapt the detector to a measurement to be performed on the specimen.

It is the object of the invention to mitigate these drawbacks and to provide an electron microscope in which focusing can be (automatically) optimized and, if desired, the adjustment of the electron microscope can be further optimized even while a measurement is being performed on a specimen. To achieve this, the method of the kind set forth in accordance with the invention is characterized in that, using the beam tilting device or wobbler, a specimen is irradiated in succession from different directions, the image information thus provided being detected in the form of pixels and recorded in order to determine a correction condition and, using an algorithm $F(s) = \Sigma |(X_i - Y_i + s)|^*$, that value s of the image shift is determined for which the function $F(s)$ is a minimum, herein referred to as the s-value, $X_i$ and $Y_i$ being the intensity values of compared image pixels after which the corresponding image correcting control variable is readjusted in dependence on the s-value thus determined.

The invention is based on the realisation that the image shift between respective different images of the object illuminated by an electron beam from corresponding different angles of illumination and hence the magnitude of a related focus aberration or image shift, and therefore the required correction can be speedily and accurately determined from the corresponding pixel form images by using the following algorithm:

$$F(\bar{S}) = \overset{\bar{i}}{\Sigma} |X\bar{i} - Y\bar{i} - s|^*$$

and determining that value for the displacement vector $\bar{S}$ for which the magnitude $F(\bar{S})$ is a minimum, referred to herein as the s-value, wherein $X\bar{i}$ and $Y\bar{i}$ are the intensity values of the two compared pixels, from the corresponding images and $\bar{i}$ is the two-dimensional vector which determines the location of the image point or pixel at which the compared intensities are correspondingly represented by $X\bar{i}$ and $Y\bar{i}$.

A variety of electron-optical conditions can be corrected in this manner such as focus, astigmatism, beam tilt, image centering and even adjustment of corrections for spherical and chromatic aberrations. Depending on the aberration to be corrected, an appropriate number of combinations of illumination beam angle and image displacements can be measured to provide the required s-values, for example, for centering the image, various combinations of the effects of beam width and image shifts must be measured. In general after determining an initial s-value this can either be used directly as the control variable to correct the aberration or, if necessary, a fine adjustment/measurement step can follow. As is known from electron optical imaging theory for a TEM, a change in the illumination beam tilt not only causes a first order image shift but also causes second order frequency-dependent image shifts. If it is necessary in order to achieve a desired accuracy of measurement, the frequency dependent shifts can be compensated or corrected in the pixel images before carrying out the calculation of the displacement vector. This can be done either in the software or by means of analog circuitry in the video input channel. It will be apparent that the correction should be carried out in such a way that the combined effects of the correction and the beam tilt on both images to be compared, are made equal. Thus in the case of two images with opposite beam tilt angles, double compensation of the effect on one of the two images is sufficient.

Because the method in accordance with the invention utilizes an arbitrary specimen and a detector which is suitable for measurements on the specimen in order to optimize the focusing condition, this method is particularly suitable for optimizing the focus during a measurement. "During a measurement" is herein intended to include: directly prior to a measurement without any setting of the electron microscope being changed between that operation and a subsequent measurement.

By comparison with methods hitherto proposed for automatic focussing, the method in accordance with the invention can be very much faster. Thus an exact defocus value can be measured in the case of a simple focus control variable by using a succession of only two images, enabling the desired focus to be set in one correction step. Most other methods employ a process which involves a search for an optimum image condition in which a large number of images must be generated and assessed at different corresponding values of the focus control variable and the optimum determined. Similar considerations are valid for the correction of spherical aberration.

The greater speed of adjustment provided by the method in accordance with the invention is important for two reasons, namely protection of the speciment and operator convenience. The computing time required to carry out the algorithm and determine the s-value can be made small by employing a dedicated processor preferably using parallel processing techniques.

A preferred embodiment utilizes a computer which comprises means for the direct automatic readjustment of electron-optical elements of the electron microscope which are involved in optimizing the adjustment. A computer of this kind is preferably also suitable for controlling the beam wobbler in synchronism with the input of image information. In order to prevent the optimum focusing condition from being less sharply defined due to, for example noise present in the imaging process, or an unusual specimen or a magnification setting for providing an extreme degree of enlargement, the computer in a preferred embodiment is arranged to determine the minimum value of the function F(s) by extrapolation from several measurement points on either side thereof. In such extreme circumstances, it could also occur that no exact s-value can be found, so that no readjustment or only an incorrect readjustment would be possible. In order to prevent such an occurrence optimization is performed in a preferred embodiment in a succession of steps. Some of the speed of the method which is so desirable in practice, is then lost, but this multi-step method need only be used in extreme situations which are usually known in advance. During a first step, for example, the focus is coarsely readjusted and a second measurement is performed with the resultant small residual amount of defocusing. It may be advantageous to use a different criterion for determining the s-value for a next step. Use can be made, for example of an algorithm as described in an article by S. J. Erasmus in "Proceedings World Congr. on EM", Hamburg, 1982, Vol, I, page 529, even when comparing each measurement point with a next value rather than with a mean value.

The (*) sign in the function for F(s) indicates that, if desired, an even power of $(X_i - Y_i + s)$ can also be used.

In a further preferred embodiment in accordance with the invention, an s-value represents a suitable criterion for minimizing astigmatism, for example by determining the s-values for different azimuth angles associated with the wobbler device. On the basis of the s-values thus found, a suitable stigmator can be energized. Similarly, a correction can also be performed for other faults in the electron optical system, for specimen shifts and the like during a measurement process. Thus for each correction the s-values are determined from data relating to the beam direction and associated image information which are relevant to the kind of aberration, shift or defocussing to be corrected. In the case of a specimen shift, it will usually be beneficial to record (mask) image information relating to a fixed position and to use it for successive corrections, rather than using for each correction a successive item of image data as is usually preferred for the other corrections.

As has already been stated, no special requirements need be imposed on a detector for performing the method. Use can be made of a single detector on which the image can be scanned. Multiple detectors can also be used together with image scanning and the greater the number of detector elements that can be employed at the same time the better the starting point for each new scanning line. In order to avoid errors due to differences in the detector elements when use is made of a mosaic detector, it is advantageous to store a look-up table containing these differences in the computer for correcting the measurement signals. Use can also be made of a detection device in the form of a video system in which case no mechanical form of image scanning would be required.

Some preferred embodiments in accordance with the invention will be described in detail hereinafter with reference to the drawing. The sole FIGURE of the drawing shows the following parts of an electron microscope 1: an electron source 2, a condenser system 4, a beam wobbler 6, a specimen holder 8 with a specimen 10, a beam deflection device 12, an imaging lens system 14, a detector 16, and a viewing screen 18. Inter alia for the execution of the method in accordance with the invention, the electron microscope is also provided with an arithmetic unit 20 with a monitor 22, a signal processing unit 24 with, for example an A-D converter and a D-A converter, and a signal read-out and control device 26.

For the execution of the method in accordance with the invention, an electron beam 30 is tilted between two opposite directions which enclose an angle x and $-x$, respectively, with respect to the main axis only angle $-x$ being illustrated. Using the variable $F(s) = \Sigma |(X_i - Y_i - s)|^*$, that value of the image shifts for which F(s) is a minimum is calculated from the image information which is read in a form relating to pixels from the detector, and that value is herein referred to as the s-value. Using the s-value thus calculated the excitation of the relevant focusing lens is adjusted to a value for optimum focus by means of the control unit 26. For an exact determination of the minimum value of F(s), measurements can be performed for different values of the angles a and $-a$ with only angle a being illustrated. Without image aberrations, such as noise, the minimum value for F(s) is thus found directly from such measurements. In the case of noise or a similar image aberration, the exact minimum and hence the relevant s-value can be found, for example by multi-point extrapolation method such as the known Savitsky-Golay b-point extrapolation method. A similar method is used for the correction of, for example astigmastism, although in that case a succession of 4 to 8 azimuthal directions would be used at which sucessive determinations would be made using the electron beam angles a and $-a$, or even a complete rotation of the electron beam about the axis throughout the surface of a cone having a half apex angle a. The s-values thus obtained are then applied to the elements of a stigmator in dependence on the azimuth, so that the astigmatism is compensated for. In order to correct the spherical aberration of the electron optical system a variable can be derived from the image shift as a function of the tilting angle by means of the measurements already performed to provide an adjustment to an optimum focus condition by using several values of the angles a and $-a$. Similarly, as has already been stated, from such measurements a variable can be derived whereby a correction can be made for specimen shift during a measurement process. The latter is notably important, for example for specimens and the like which have to be adjusted to a given temperature.

A favourable application of the method is found in the automatic correction of focus and astigmatism in a scanning electron microscope. Notably in such a measurement apparatus the substantial saving of time which can be achieved in acordance with the invention, is of decisive importance. It is also important that objective criteria for adjustment should be used for the often used mutual comparison of measurement results by means of such an apparatus. The other forms of error are of comparatively small importance for this type of apparatus. This is certainly not the case, for example for a transmission electron microscope which, fortunately, usually includes a beam wobbler. For high-quality apparatus of this kind automatic adjustment and correction of the electron-optical system is extremely important for optimum imaging. Notably, because of the high degree of precision required of the adjustments for realizing the high resolution and also because of the presence of a large number of electron-optical elements, manual adjustment is very time-consuming in such apparatus. Regardless of the loss of time as such, it is also a major drawback that a specimen must be irradiated during the entire adjustment period. Consequently, burning and contamination of the specimen can easily occur, thus affecting the image formation. All these drawbacks are avoided in an electron microscope in accordance with the invention.

We claim:

1. A method of optimally adjusting an image-correcting control variable in an electron microscope including an electron source, an illumination beam tilting device, an electron-optical lens system, and an electron detection device, characterized in that, using the illumination beam tilting device a specimen is irradiated in succession from different predetermined illumination angles, the image information thus provided being detected in the form of pixels and recorded in order to determine an optimum correction condition and, using an algorithm $F(s) = \Sigma(Xi - Yi + s)^*$, that value s of the image shift is determined for which the function F(s) is minimum, herein referred to as the s-value, where Xi and Yi are the intensity values of the compared pixels from images, resulting from corresponding successive tilt angles, i is the two-dimensional vector index which specifies the location of the image point at which the intensities Xi and Yi are compared, after which the corresponding image-correcting control variable is readjusted in dependence on the s-value thus determined, and * indicates the absolute value of the quantity or an even power thereof.

2. A method as claimed in claim 1, characterized in that the s-value thus determined is used to correct focus aberrations in the electron-optical lens system.

3. A method as claimed in claim 1 or 2, characterized in that there is provided a control device for controlling the illumination beam tilting device in synchronism with the measurement of the image information.

4. A method as claimed in claim 1 or 2, characterized in that before the s-value is calculated, at least one of the two images is corrected for frequency dependent image shift.

5. A method as claimed in claim 1 or 2, characterized in that the correction is automatically performed.

6. A method as claimed in claim 1 or 2, characterized in that for reducing the effect of object shifts on the determination of the s-value, direct beam tilting is performed, each time between two values of tilt which are symmetrically situated with respect to a zero value.

7. A method as claimed in claim 1 or 2, characterized in that a multi-point extrapolation method is used in order to determine the minimum value of F(s).

8. A method as claimed in claim 1 or 2, characterized in that the s-value thus determined is used to correct for undesirable shifts of an object under examination.

9. A method as claimed in claim 8, characterized in that there is provided a control device for controlling the illumination beam tilting device in synchronism with the measurement of the image information.

10. A method as claimed in claim 8, characterized in that before the s-value is calculated, at least one of the two images is corrected for frequency dependent image shift.

11. A method as claimed in claim 8, characterized in that the correction is automatically performed.

12. A method as claimed in claim 8, characterized in that for reducing the effect of object shifts on the determination of the s-value, direct beam tilting is performed, each time between two values of tilt which are symmetrically situated with respect to a zero value.

13. A method as claimed in claim 8, characterized in that a multi-point extrapolation method is used in order to determine the minimum value of F(s).

* * * * *